(12) United States Patent
Sackinger

(10) Patent No.: US 6,958,668 B1
(45) Date of Patent: Oct. 25, 2005

(54) ACTIVE INDUCTOR

(75) Inventor: Eduard Sackinger, Shrewsbury, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 473 days.

(21) Appl. No.: 09/498,559

(22) Filed: Feb. 4, 2000

(51) Int. Cl.$^7$ ............................................. H03H 11/40
(52) U.S. Cl. ........................................ 333/214; 331/66
(58) Field of Search ................................ 327/427, 306, 327/443, 383, 389, 589; 333/214, 215, 217; 331/66, 40

(56) References Cited

U.S. PATENT DOCUMENTS

| | | | |
|---|---|---|---|
| 5,672,992 A | | 9/1997 | Nadd .......................... 327/390 |
| 5,821,825 A | * | 10/1998 | Kobayashi ................... 331/66 |
| 6,069,516 A | * | 5/2000 | Vargha ........................ 327/589 |

OTHER PUBLICATIONS

"Broad-Band Monolithic Microwave Active Inductor and Its Application to Miniaturized Wide-Band Amplifiers" by S. Hara, T. Tokumitsu, T. Tanaka, and M. Aikawa, IEEE Transactions on Microwave Theory and Techniques, vol. 36, No. 12, Dec., 1998.

Jin-So Ko, et al., "Low Power, Tunable Active Inductor and its Applications to Monolithic VCO and BPF", Microwave Symposium Digest, 1997. IEEE MTT-S International Denver, CO USA Jun. 8-13, 1997, New York, NY, pp. 929-932.

Jin-So Ko, et al., "Low Power, Tunable Active Inductor and its Applications to Monolithic VCO and BPF", Microwave Symposium Digest, 1997. IEEE MTT-S International Denver, CO USA Jun. 8-13, 1997, New York, NY, p. 929, left hand column, line 1, p. 930, left hand column, lione 7, Figure 1.

Dunn, W.: "Driving and Protection of high Side NMOS Power Switches", Conference Record of the Industry Applications Society Annual Meeting., Seattle, WA, Oct. 7-12, 1990, New York, NY, IEEE, US, vol. 2. meeting 25, pp. 1626-1628, legt hand column, line 5.

* cited by examiner

Primary Examiner—Dinh T. Le
(74) Attorney, Agent, or Firm—E. J. Rosenthal

(57) ABSTRACT

An active inductor with a smaller voltage drop with respect to the power supply voltage of an integrated circuit can be realized by an active inductor which is biased from a voltage higher than the power supply voltage, the higher voltage being generatable on the integrated circuit. Advantageously, more headroom is left for the amplifying circuit coupled to the active inductor to operate properly than with prior art active inductors. Furthermore, by not simply operating the entire active inductor from a higher voltage, the power dissipation remains the same as if the active inductor were connected as in the prior art only to the power supply voltage, and the task of generating the voltage higher than the power supply voltage is simplified, because only leakage current, e.g., nanoamps, is required.

19 Claims, 2 Drawing Sheets

ACTIVE INDUCTOR

TECHNICAL FIELD

This invention relates to the art of active inductors, and more particularly, to active inductors for use in circuits operating with a low power supply voltage.

BACKGROUND OF THE INVENTION

As is well known, inductors can be used to expand the bandwidth of amplifiers. When an amplifier requiring an inductor is implemented on an integrate circuit, the inductor may be implemented either as spiral inductor or as an active inductor. The problems with using a spiral inductor are that a spiral inductor is large, and its useful frequency range is limited by self resonance. Although active inductors are small, and they typically have a greater frequency range than a spiral inductor, active inductors suffer from the problem of requiring a relatively large voltage drop, with respect to the power supply voltage, across the active inductor. With power supply voltages decreasing, to reduce power consumption, the relatively large voltage drop of prior art active inductors becomes problematic, in that it does not leave enough headroom for the amplifying circuit coupled to the active inductor to operate properly.

SUMMARY OF THE INVENTION

I have recognized that an active inductor with a smaller voltage drop with respect to the power supply voltage of an integrated circuit can be realized, in accordance with the principles of the invention, by an active inductor which is biased from a voltage higher than the power supply voltage, the higher voltage being generatable on the integrated circuit. Advantageously, more headroom is left for the amplifying circuit coupled to the active inductor to operate properly than with prior art active inductors. Furthermore, by not simply operating the entire active inductor from a higher voltage, the power dissipation remains the same as if the active inductor were connected as in the prior art only to the power supply voltage, and the task of generating the voltage higher than the power supply voltage is simplified, because only leakage current, e.g., nanoamps, is required.

DETAILED DESCRIPTION

Figure 1:
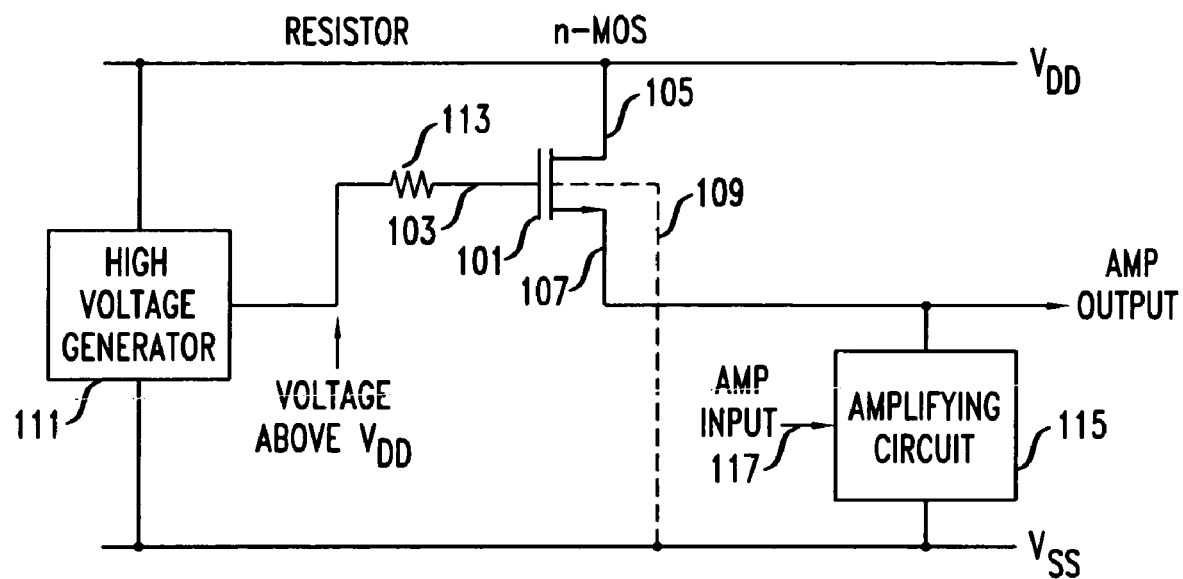
FIG. 1 shows an exemplary active inductor arranged in accordance with the principles of the invention so as to realize a smaller voltage drop with respect to the power supply voltage than was achievable by the prior art.

The following merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams herein represent conceptual views of illustrative circuitry embodying the principles of the invention. Similarly, it will be appreciated that any flow charts, flow diagrams, state transition diagrams, pseudocode, and the like represent various processes which may be substantially represented in computer readable medium and so executed by a computer or processor, whether or not such computer or processor is explicitly shown.

The functions of the various elements shown in the FIGs., including functional blocks labeled as "processors" may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read-only memory (ROM) for storing software, random access memory (RAM), and non-volatile storage. Other hardware, conventional and/or custom, may also be included. Similarly, any switches shown in the FIGS. are conceptual only. Their function may be carried out through the operation of program logic, through dedicated logic, through the interaction of program control and dedicated logic, or even manually, the particular technique being selectable by the implementor as more specifically understood from the context.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein.

Unless otherwise explicitly specified herein, the drawings are not drawn to scale.

FIG. 1 shows an exemplary active inductor arranged in accordance with the principles of the invention so as to realize a smaller voltage drop with respect to the power supply voltage than was achievable by the prior art. More specifically, the active inductor is biased from a voltage higher than the power supply voltage, the higher voltage being generatable on the integrated circuit. Shown in FIG. 1 are metal oxide semiconductor (MOS) transistor 101, including gate terminal 103, drain terminal 105, source terminal 107, bulk terminal 109, power supply voltage Vdd, high voltage generator 111, gate resistor 113, and power supply voltage Vss.

Also shown in FIG. 1 is optional amplifying circuit 115, which uses the active inductor as part of its load in performing amplification of input signal 117.

In the embodiment of the invention shown in FIG. 1, MOS transistor 101 is a negative metal oxide semiconductor (NMOS) transistor. Drain terminal 105 is connected to power supply voltage Vdd. An exemplary value for power supply voltage Vdd for use with contemporary integrated circuit technology is, nominally, 2.5V, with Vss being 0V, although other, and in particular, lower power supply voltages are possible. Bulk terminal 109 is coupled to Vss.

High voltage generator 111 is coupled between Vdd and Vss and uses power from the power supply to generate a voltage higher than Vdd. Preferably the higher voltage generated is one threshold voltage above Vdd. Lower "higher voltages" do not give as much headroom, while higher "higher voltages" can cause transistor 101 to stop behaving like an active inductor, e.g., by leaving saturation mode. For example, with a power supply voltage of 2.5V, high voltage generator 111 supplies at its output 3.4V. The generation of the higher voltage by high voltage generator 111 may be performed in any manner desired by the implementor. One such manner is disclosed in FIG. 3 and is described further hereinbelow. Since high voltage generator 111 acts as a voltage source, preferably it has a low output impedance.

Gate resistor 113 is coupled between gate terminal 103 and the output of high voltage generator 111.

In operation, the circuit of FIG. 1 behaves substantially the same as a prior art active inductor which would have the terminal of gate resistor 113 that is not coupled to gate terminal 103 coupled to Vdd. For a detailed description of prior art active inductors see, for example, *Broad-Band Monolithic Microwave Active Indcutor and Its Application to Minaturized Wide-Band Amplifiers* by Hara et al., published in IEEE Tansactions on Microwave Theory and Techniques, Vol. 36, No. 12, pp. 1920–1924, December 1988, which is incorporated by reference as if fully set forth herein. However, because in the circuit of FIG. 1 the terminal of gate resistor 113 that is not coupled to gate terminal 103 is coupled to the higher voltage supplied as an output by high voltage generator 111, the voltage drop between Vdd and source terminal 107 is reduced. Advantageously, this permits greater headroom for the operation of an amplifying circuit, e.g., optional amplifying circuit 115, that uses the active inductor as part of its load.

Figure 2:
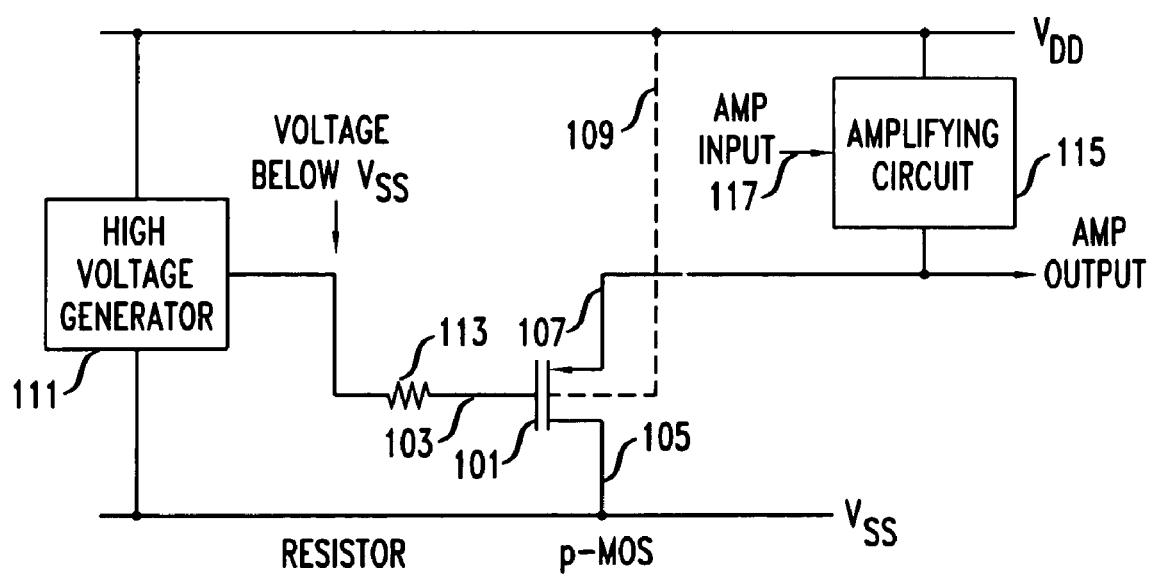
FIG. 2 shows an exemplary active inductor arranged in accordance with the principles of the invention so as to realize a smaller voltage drop with respect to the power supply voltage than was achievable by the prior art that uses the same structure as does FIG. 1 but is modified for use with a PMOS transistor.

FIG. 2 shows an exemplary active inductor arranged in accordance with the principles of the invention so as to realize a smaller voltage drop with respect to the power supply voltage than was achievable by the prior art that uses the same structure as does FIG. 1 but is modified for use when MOS transistor 101 is a positive metal oxide semiconductor (PMOS) transistor. Note that elements of FIG. 2 having the same reference numerals as elements of FIG. 1 are the same as described for FIG. 1, execept that MOS transistor 101 is a PMOS transistor in FIG. 2. Given the description of FIG. 1, those of ordinary skill in the art will readily understand and be able to implement active inductors using PMOS transistors as shown in FIG. 2.

Figure 3:
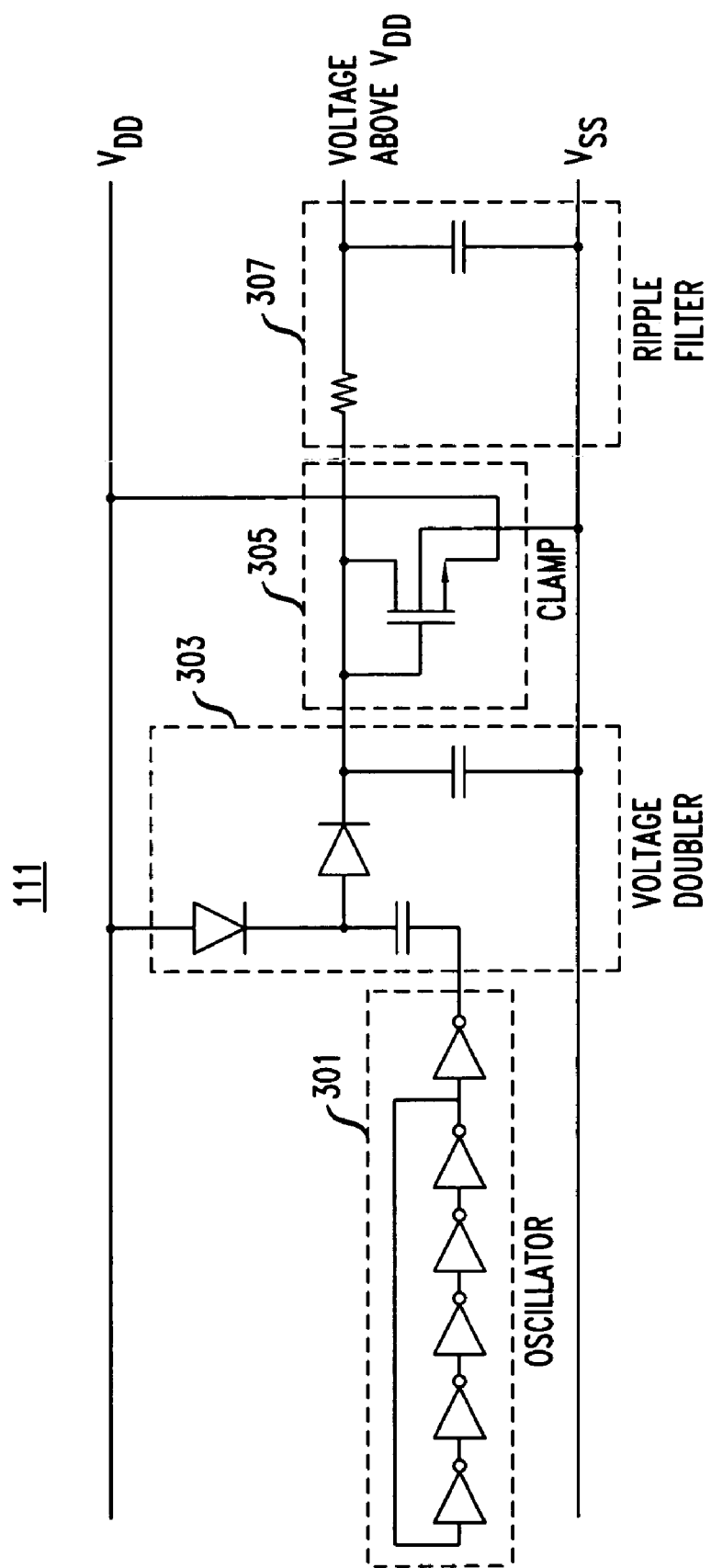
FIG. 3 shows an exemplary embodiment of the high voltage generator of FIG. 1.

FIG. 3 shows an exemplary embodiment of high voltage generator 111. Shown in FIG. 3 are oscillator 301, voltage doubler 303, clamp 305, and ripple filter 307, which are cascaded in sequence in the manner shown. Each of oscillator 301, voltage doubler 303, clamp 305 and ripple filter 307 are well known in the art, and the particular structure shown within each is for pedagogical purposes only. Coarsely, in idealized operation, the square wave generated by oscillator 301 causes a voltage of twice Vdd to be generated by voltage doubler 303. This voltage is then clamped to one threshold voltage above Vdd by clamp 305, and any ripple from the square wave is filtered out by ripple filter 307. Any particular actual embodiment must, of course, as will be readily recognized by those of ordinary skill in the art, take into account actual circuit operating parameters, especially the voltage drops across the diodes of voltage doubler 303.

What is claimed is:

1. A circuit for use as an active inductor on an integrated circuit having a power supply voltage supplied at a first power supply terminal, comprising:

an metal oxide semiconductor (MOS) transistor having a gate terminal, a drain terminal, and a source terminal, said drain terminal being coupled to said power supply voltage and said source terminal being one of the terminals of said active inductor; and a resistor having a first terminal coupled to said gate terminal and a second terminal coupled to a voltage that is derived from said power supply voltage and has a larger absolute value than said power supply voltage supplied at said first power supply terminal and the same sign as said power supply voltage;

said circuit being adapted so that when said circuit is operating said circuit behaves as an active inductor between said source terminal and an other terminal of said active inductor on said integrated circuit.

2. The invention as defined in claim 1 wherein other terminal of said active inductor is said first power supply terminal.

3. The invention as defined in claim 1 wherein said MOS transistor also has a bulk terminal, said bulk terminal being connected to a second power supply terminal.

4. The invention as defined in claim 1 wherein MOS transistor is a negative metal oxide semiconductor (NMOS) transistor.

5. The invention as defined in claim 1 wherein MOS transistor is a positive metal oxide semiconductor (PMOS) transistor.

6. The invention as defined in claim 1 wherein said MOS transistor also has a bulk terminal, said bulk terminal being connected to a second power supply terminal, and wherein said power supply voltage supplied from said first power supply terminal is higher than a voltage supplied from said second power supply terminal.

7. The invention as defined in claim 1 wherein said MOS transistor also has a bulk terminal, said bulk terminal being connected to a second power supply terminal, and wherein said power supply voltage supplied from said first power supply terminal is lower than a voltage supplied from said second power supply terminal.

8. The invention as defined in claim 1 wherein said MOS transistor is a negative metal oxide semiconductor (NMOS) transistor, said NMOS transistor also has a bulk terminal, said bulk terminal being connected to a second power supply terminal, and wherein said first power supply terminal is the positive power supply terminal for said integrated circuit and said second power supply terminal is the negative power supply terminal for said integrated circuit.

9. The invention as defined in claim 1 wherein said MOS transistor is a positive metal oxide semiconductor (PMOS) transistor, said PMOS transistor also has a bulk terminal, said bulk terminal being connected to a second power supply terminal, and wherein said first power supply terminal is the negative power supply terminal for said integrated circuit and said second power supply terminal is the positive power supply terminal for said integrated circuit.

10. The invention as defined in claim 1 wherein said voltage that is derived from said power supply voltage and has a larger absolute value than said power supply voltage supplied by said first power supply terminal and the same sign as said power supply voltage has a larger absolute value than said power supply by one threshold voltage of said MOS transistor.

11. The invention as defined in claim 1 wherein said voltage that is derived from said power supply voltage is generated from said power supply voltage by a high voltage generator.

12. The invention as defined in claim 1 further including on said integrated circuit a high voltage generator that generates said voltage that has a larger absolute value than said power supply voltage supplied by said first power supply terminal and the same sign as said power supply voltage.

13. The invention as defined in claim 1 further including on said integrated circuit a high voltage generator that generates said voltage that has a larger absolute value than said power supply voltage supplied by said first power supply terminal and the same sign as said power supply voltage, said high voltage generator comprising:

an oscillator generating an oscillating output signal;

a voltage doubler receiving as an input said oscillating output signal from said oscillator and supplying as an output a signal that has an average larger absolute value than said power supply voltage supplied by said first power supply terminal and the same sign as said power supply voltage;

a clamp which receives as an input said output of said voltage doubler and supplies an output voltage substantially clamped to a prescribed value that has a larger absolute value than said power supply voltage supplied by said first power supply terminal and the same sign as said power supply voltage;

and a ripple filter which filters said output of said clamp and supplies the output of said high voltage generator, which said voltage that has a larger absolute value than said power supply voltage supplied by said first power supply terminal and the same sign as said power supply voltage.

14. A circuit for use as an active inductor on an integrated circuit, comprising:

a metal oxide semiconductor (MOS) transistor; and a beyond voltage generator which generates a beyond voltage that is either greater than the highest voltage or less than the lowest voltage being supplied to said integrated circuit by a power supply;

wherein said MOS transistor is coupled to said beyond voltage generator so as to bias said MOS transistor with said beyond voltage and said MOS transistor is adapted to operate as said active inductor.

15. The invention as defined in claim 14 wherein said beyond voltage generator comprises:

an oscillator generating an oscillating output signal;

a voltage doubler receiving as an input said oscillating output signal from said oscillator and supplying as an output a voltage signal that has an average voltage that is either greater than the highest voltage or less than the lowest voltage being supplied to said integrated circuit by a power supply;

a clamp which receives as an input said output of said voltage doubler and supplies an output voltage substantially clamped to a prescribed value that is greater than the highest voltage or less than the lowest voltage being supplied to said integrated circuit by a power supply;

and a ripple filter which filters said output of said clamp and supplies the output of said beyond voltage generator.

16. An integrated circuit comprising a metal oxide semiconductor (MOS) transistor adapted to operate as an active inductor that is biased using a voltage generated on said integrated circuit that is outside the range of the voltage supplied by a power supply off of said integrated circuit for operating said integrated circuit.

17. The invention as defined in claim 16 wherein said MOS transistor is a negative metal oxide semiconductor (NMOS) transistor.

18. The invention as defined in claim 16 wherein said MOS transistor is a positive metal oxide semiconductor (PMOS) transistor.

19. The invention as defined in claim 16 wherein said active inductor is biased by coupling a gate of said MOS transistor to said voltage generated on said integrated circuit that is beyond the range of the voltage supplied by a power supply for operating said integrated circuit via an impedance.

* * * * *